(12) United States Patent
Honda et al.

(10) Patent No.: US 12,115,938 B2
(45) Date of Patent: Oct. 15, 2024

(54) VEHICLE, NOTIFICATION SYSTEM, NOTIFICATION METHOD, AND NON-TRANSITORY COMPUTER-READABLE STORAGE MEDIUM STORED WITH A NOTIFICATION PROGRAM

(71) Applicant: TOYOTA JIDOSHA KABUSHIKI KAISHA, Toyota (JP)

(72) Inventors: Shota Honda, Miyoshi (JP); Jumpei Fuke, Toyota (JP); Kuniharu Tsuzuki, Handa (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/818,033

(22) Filed: Aug. 8, 2022

(65) Prior Publication Data
US 2023/0095517 A1 Mar. 30, 2023

(30) Foreign Application Priority Data
Sep. 30, 2021 (JP) ................. 2021-161766

(51) Int. Cl.
*B60R 25/40* (2013.01)
*B60K 35/00* (2024.01)
*G01R 31/371* (2019.01)
*G01R 31/387* (2019.01)
*B60K 35/28* (2024.01)
*G08B 21/18* (2006.01)

(52) U.S. Cl.
CPC ........... *B60R 25/403* (2013.01); *B60K 35/00* (2013.01); *G01R 31/371* (2019.01); *G01R 31/387* (2019.01); *B60K 35/28* (2024.01); *B60K 2360/178* (2024.01); *G08B 21/182* (2013.01)

(58) Field of Classification Search
CPC .. B60R 25/403; G01R 31/387; G01R 31/371; B60K 35/00; B60K 2370/178; G08B 21/182
See application file for complete search history.

(56) References Cited

U.S. PATENT DOCUMENTS

| | | | | |
|---|---|---|---|---|
| 5,315,287 | A * | 5/1994 | Sol ......................... | H02J 7/0048 320/DIG. 19 |
| 9,031,545 | B1 * | 5/2015 | Srey ........................ | H04W 4/48 455/418 |
| 9,725,072 | B2 * | 8/2017 | Morita .................. | B60R 25/245 |
| 11,210,877 | B1 * | 12/2021 | Amadi .................. | B60R 25/245 |
| 11,377,111 | B1 * | 7/2022 | Guziec ................. | G01G 19/086 |
| 11,598,838 | B2 * | 3/2023 | Oman ................... | B60R 25/245 |
| 11,615,370 | B1 * | 3/2023 | Li ..................... | G06Q 10/08355 705/338 |

(Continued)

FOREIGN PATENT DOCUMENTS

JP 2021-120530 A 8/2021

*Primary Examiner* — Chico A Foxx
(74) *Attorney, Agent, or Firm* — Oblon, McClelland, Maier & Neustadt, L.L.P.

(57) ABSTRACT

A vehicle that is configured to: acquire information relating to a remaining charge of a battery of a terminal configured to act as a digital key employed in control of a vehicle; and perform a predetermined notification in response to both of a determination being made that the remaining charge of the battery of the terminal is a predetermined threshold or lower based on the acquired information, and the vehicle being in a preset vehicle state.

6 Claims, 9 Drawing Sheets

(56) References Cited

U.S. PATENT DOCUMENTS

| | | | | |
|---|---|---|---|---|
| 2008/0048846 A1* | 2/2008 | Nagai | ............ | B60R 25/24 |
| | | | | 340/426.17 |
| 2010/0201478 A1* | 8/2010 | Veen | ............ | H04L 67/52 |
| | | | | 340/3.1 |
| 2012/0196583 A1* | 8/2012 | Kindo | ............ | H04M 1/6091 |
| | | | | 455/420 |
| 2013/0030689 A1* | 1/2013 | Yamaguchi | ............ | G01C 21/3688 |
| | | | | 701/409 |
| 2013/0196612 A1* | 8/2013 | Cepuran | ............ | G08B 21/025 |
| | | | | 455/404.1 |
| 2014/0035514 A1* | 2/2014 | Wang | ............ | H04W 52/0248 |
| | | | | 320/155 |
| 2014/0043135 A1* | 2/2014 | Kotecha | ............ | G05B 19/0428 |
| | | | | 340/3.1 |
| 2014/0184428 A1* | 7/2014 | Healey | ............ | G08G 1/096741 |
| | | | | 340/932.2 |
| 2016/0037482 A1* | 2/2016 | Higgins | ............ | G06Q 10/10 |
| | | | | 455/414.1 |
| 2016/0073351 A1* | 3/2016 | Cardozo | ............ | H04W 52/0258 |
| | | | | 455/574 |
| 2016/0217675 A1* | 7/2016 | Schroeder | ............ | H02J 50/90 |
| 2017/0126680 A1* | 5/2017 | Yusuf | ............ | H04L 67/12 |
| 2017/0297620 A1* | 10/2017 | Lavoie | ............ | B62D 13/06 |
| 2017/0366952 A1* | 12/2017 | Mori | ............ | G08C 17/02 |
| 2018/0215395 A1* | 8/2018 | Keany | ............ | G06F 18/22 |
| 2018/0290622 A1* | 10/2018 | Mori | ............ | G08B 21/00 |
| 2018/0316788 A1* | 11/2018 | Elliott | ............ | H04W 4/02 |
| 2019/0039474 A1* | 2/2019 | Wada | ............ | B60L 58/10 |
| 2020/0162859 A1* | 5/2020 | Mitra | ............ | B60R 22/48 |
| 2021/0237684 A1 | 8/2021 | Sakurada et al. | | |
| 2021/0241627 A1* | 8/2021 | Babcock | ............ | G07B 15/02 |

\* cited by examiner

VEHICLE, NOTIFICATION SYSTEM, NOTIFICATION METHOD, AND NON-TRANSITORY COMPUTER-READABLE STORAGE MEDIUM STORED WITH A NOTIFICATION PROGRAM

CROSS-REFERENCE TO RELATED APPLICATION

This application is based on and claims priority under 35 USC 119 from Japanese Patent Application No. 2021-161766 filed on Sep. 30, 2021, the disclosure of which is incorporated by reference herein.

BACKGROUND

Technical Field

The present disclosure relates to a vehicle, a notification system, a notification method, and a non-transitory computer-readable storage medium stored with a notification program.

Related Art

Japanese Patent Application Laid-Open (JP-A) No. 2021-120530 discloses a digital key system in which vehicle control such as locking and unlocking of vehicle doors is implemented by operation of an information processing device such as a smartphone capable of acting as a digital key.

In such digital key systems, if a battery of the information processing device such as a smartphone capable of acting as a digital key goes flat, the vehicle cannot be controlled, and so there is a need to forestall the battery of the information processing device going flat.

SUMMARY

An aspect of the present disclosure is a vehicle, that includes: a memory; and a processor coupled to the memory, the processor being configured to: acquire information relating to a remaining charge of a battery of a terminal configured to act as a digital key employed in control of a vehicle; and perform a predetermined notification in response to both of a determination being made that the remaining charge of the battery of the terminal is a predetermined threshold or lower based on the acquired information, and the vehicle being in a preset vehicle state.

DETAILED DESCRIPTION

Figure 1:
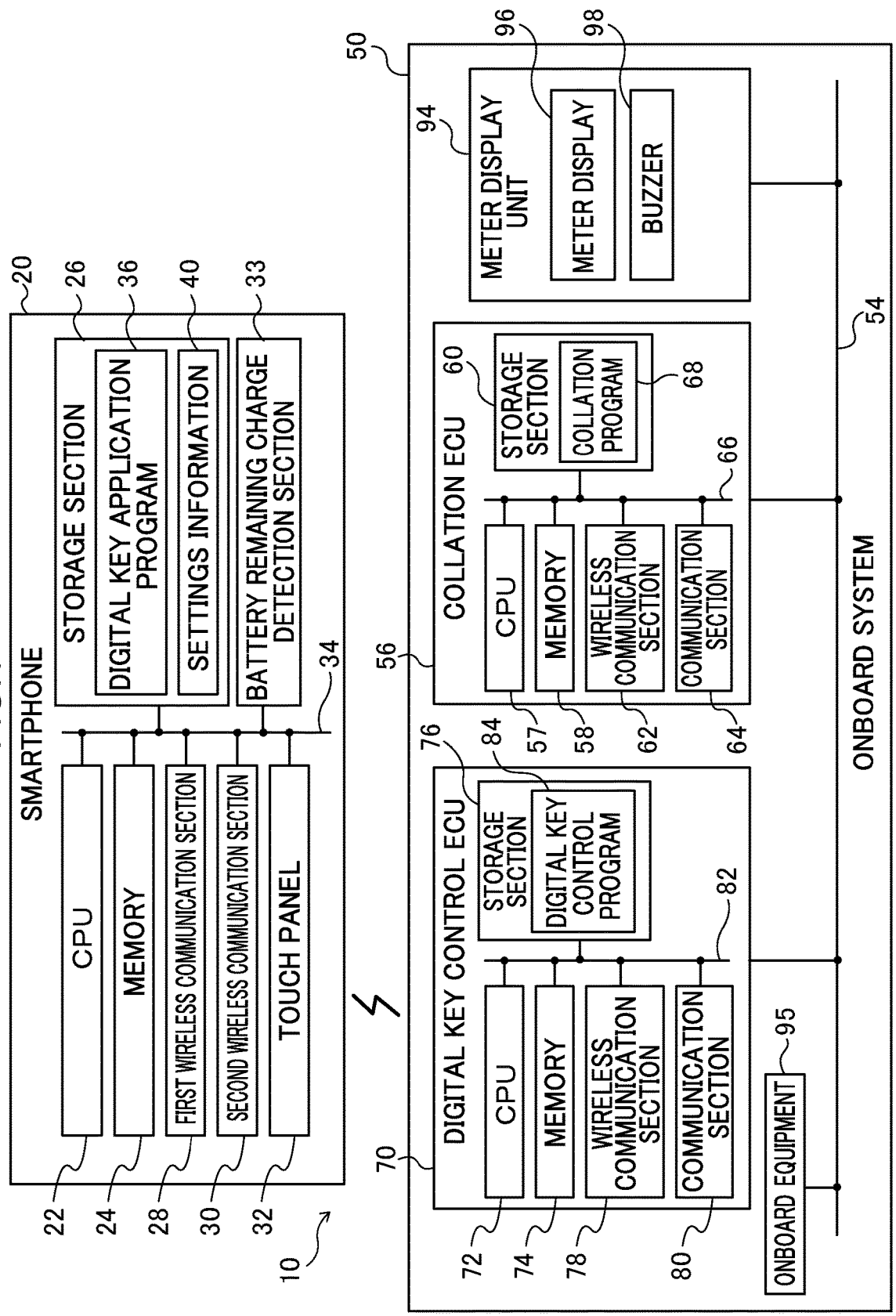
FIG. 1 is a block diagram illustrating an example of a schematic configuration of a notification system.

Detailed explanation follows regarding an example of an exemplary embodiment of the present disclosure, with reference to the drawings. A notification system 10 illustrated in FIG. 1 includes a vehicle 50 installed with an onboard system 52, and a smartphone 20 possessed by a user who utilizes the vehicle 50. Note that the smartphone 20 is an example of an information processing device corresponding to a terminal of the present disclosure.

Figure 2:
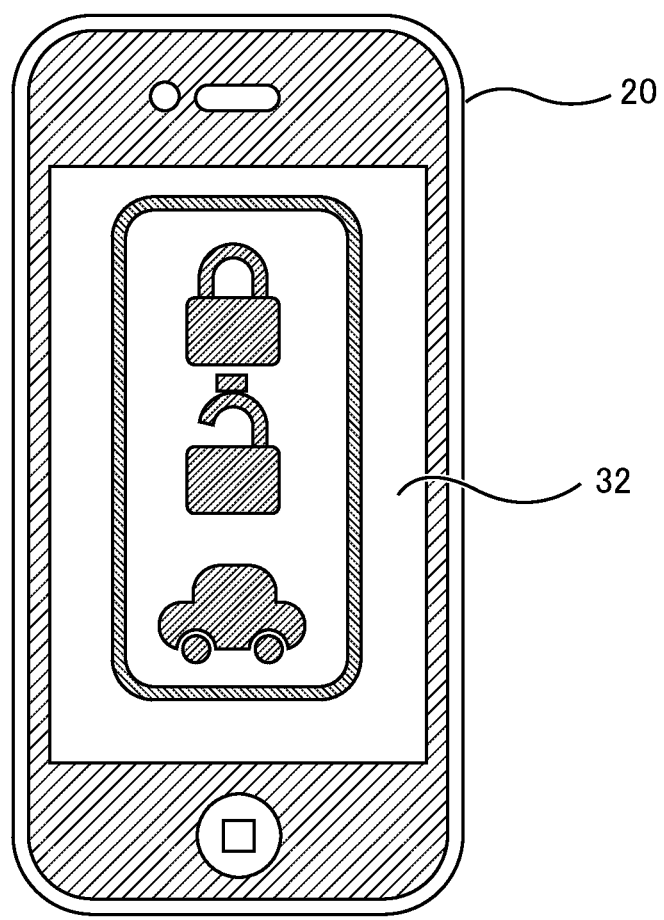
FIG. 2 is a plan view illustrating an example of an external appearance of a smartphone.

The smartphone 20 includes a central processing unit (CPU) 22, and memory 24 such as read only memory (ROM) and random access memory (RAM). The smartphone 20 also includes a non-volatile storage section 26 such as a hard disk drive (HDD) or a solid state drive (SSD), a first wireless communication section 28 that oversees wireless communication with a server etc., and a second wireless communication section 30 that oversees wireless communication (wireless communication following a standard such as Bluetooth Low Energy (BLE)) with the vehicle 50 side. The smartphone 20 also includes a touch panel 32 (see FIG. 2 also), and a battery remaining charge detection section 33 that detects a remaining charge of a battery inbuilt in the smartphone 20. The CPU 22 serving as an example of a hardware processor, the memory 24, the storage section 26 (which may be referred to as memory), the first wireless communication section 28, the second wireless communication section 30, the touch panel 32, and the battery remaining charge detection section 33 are connected so as to be capable of communicating with one another through an internal bus 34.

In the present exemplary embodiment, a digital key application program 36 and digital key information for causing the smartphone 20 to act as a digital key are downloaded to the smartphone 20 from the server, and pre-stored (installed) in the storage section 26. By employing this digital key application program 36 and the digital key information, the smartphone 20 can be made to act as a digital key.

Thus, in cases in which a user borrows the vehicle 50 from an owner of the vehicle 50, there is no need for the owner of the vehicle 50 to physically hand their smart key over the user, and the user is able to share use of the key of the vehicle 50 simply by the exchange of electronic information, even if the user is located at a remote location. As merit for the owner of the vehicle 50 also, since the smartphone 20 can be made to act as a digital key, the owner does not need to take out their smart key if they have their smartphone 20 while out and about.

Note that since pairing is executed between the smartphone 20 and the vehicle 50 side, pairing information is also stored in the storage section 26.

Figure 3:
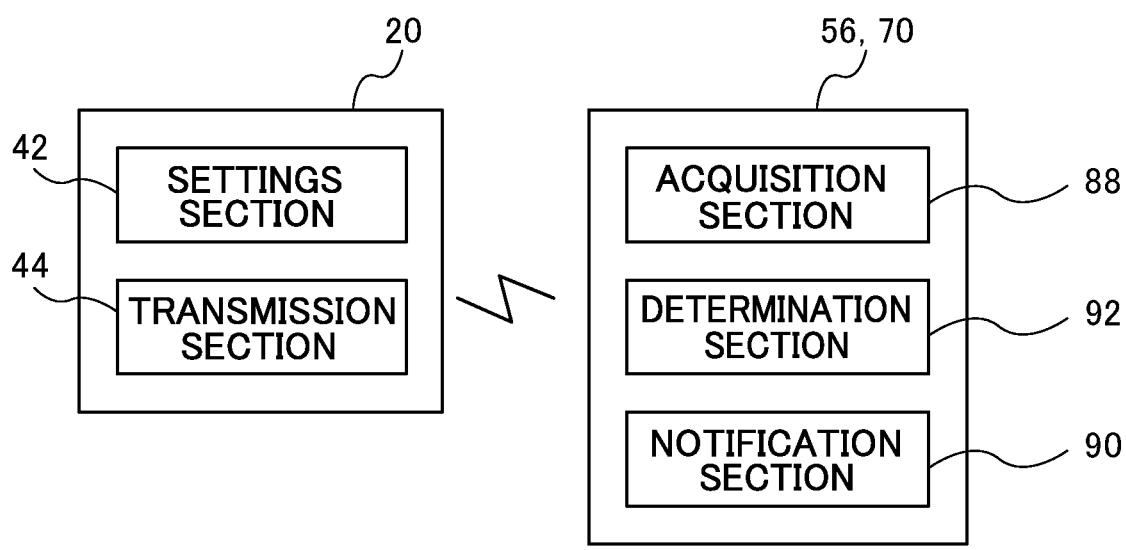
FIG. 3 is a functional block diagram illustrating an example of a smartphone, a collation ECU, and a digital key control ECU.

The digital key application program 36 is read from the storage section 26 and expanded in the memory 24, and the digital key application program 36 expanded in the memory 24 is loaded and executed by the CPU 22. The smartphone 20 thereby functions as a settings section 42 and a transmission section 44 illustrated in FIG. 3.

The settings section 42 displays a notification settings screen on the touch panel 32 of the smartphone 20, and causes the user of the smartphone 20 to set a battery remaining charge threshold as a notification target and vehicle state information for notifying of a drop in the battery remaining charge (described in detail later).

The transmission section 44 transmits information relating to the remaining charge of the battery to the vehicle 50 in cases in which a determination is made that a battery remaining charge B of the smartphone 20 has fallen to a first threshold or lower. The transmission section 44 also transmits the battery remaining charge-related information to the vehicle 50 in cases in which a determination is made that the battery remaining charge that was once the first threshold or lower and then recovered to a second threshold higher than the first threshold has again fallen to the first threshold or lower. On the other hand, the transmission section 44 does not transmit the battery remaining charge-related information to the vehicle 50 in cases in which a determination is made that the battery remaining charge that was once the first threshold or lower has again fallen to the first threshold or lower without first recovering to the second threshold.

The onboard system 52 includes a system bus 54. A collation electronic control unit (ECU) 56, a digital key control ECU 70, onboard equipment 94, and a meter display unit 94 are connected so as to be capable of communicating with one another through the system bus 54.

The onboard equipment 94 includes equipment such as a door locking device and a back door (or trunk) opening/closing device as equipment installed in the vehicle 50 that is controllable by the smartphone 20. The onboard equipment 94 also includes equipment such as a shift device and a vehicle speed sensor as equipment that outputs vehicle state-related information.

The collation ECU 56 includes a CPU 57, memory 58 such as ROM and RAM, and a non-volatile storage section 60 such as an HDD or an SSD. The collation ECU 56 also includes a wireless communication section 62 that oversees wireless communication with the smart key possessed by the owner of the vehicle 50 and compatible with the vehicle 50, and a communication section 64 that oversees communication through the system bus 54. The CPU 57 serving as an example of a hardware processor, the memory 58, the storage section 60 (which may be referred to as memory), the wireless communication section 62, and the communication section 64 are connected so as to be capable of communicating with one another through an internal bus 66.

A collation program 68 is pre-stored in the storage section 60. The collation program 68 is read from the storage section 60 and expanded in the memory 58, and the collation program 68 expanded in the memory 58 is loaded and executed by the CPU 57. The collation ECU 56 thereby functions as part of a determination section 92 and part of a notification section 90 illustrated in FIG. 3. The collation ECU 56 acquires information such as the shift position and vehicle speed as the vehicle state-related information from equipment such as the shift device and the vehicle speed sensor of the onboard equipment 94, these being examples of equipment that output the vehicle state-related information.

The digital key control ECU 70 includes a CPU 72, memory 74 such as ROM and RAM, a non-volatile storage section 76 such as an HDD or an SSD, a wireless communication section 78 that oversees wireless communication with the smartphone 20, and a communication section 80 that oversees communication through the system bus 54. The CPU 72, the memory 74, the storage section 76, the wireless communication section 78, and the communication section 80 are connected so as to be capable of communicating with one another through an internal bus 82.

A digital key control program 84 is pre-stored in the storage section 76. The digital key control program 84 is read from the storage section 76 and expanded in the memory 74, and the digital key control program 84 expanded in the memory 74 is loaded and executed by the CPU 72. The digital key control ECU 70 thereby functions as an acquisition section 88, and also functions as part of the determination section 92 and part of the notification section 90 illustrated in FIG. 3.

The acquisition section 88 acquires information relating to the remaining charge of the battery of the smartphone 20 that is capable of acting as a digital key employed in control of the vehicle 50. The determination section 92 determines whether or not the vehicle 50 is in a preset vehicle state based on the vehicle state-related information acquired from the equipment such as the shift device and the vehicle speed sensor. The notification section 90 performs a predetermined notification in cases in which a determination is made that the battery remaining charge B of the smartphone 20 is a predetermined threshold or lower based on the information acquired by the acquisition section 88, and a determination is also made by the determination section 92 that the vehicle 50 is in the preset vehicle state.

Note that the collation program 68 stored in the storage section 60 of the collation ECU 56 and the digital key control program 84 stored in the non-volatile storage section 76 of the digital key control ECU 70 are examples of a notification program according to the present disclosure.

Figure 9:
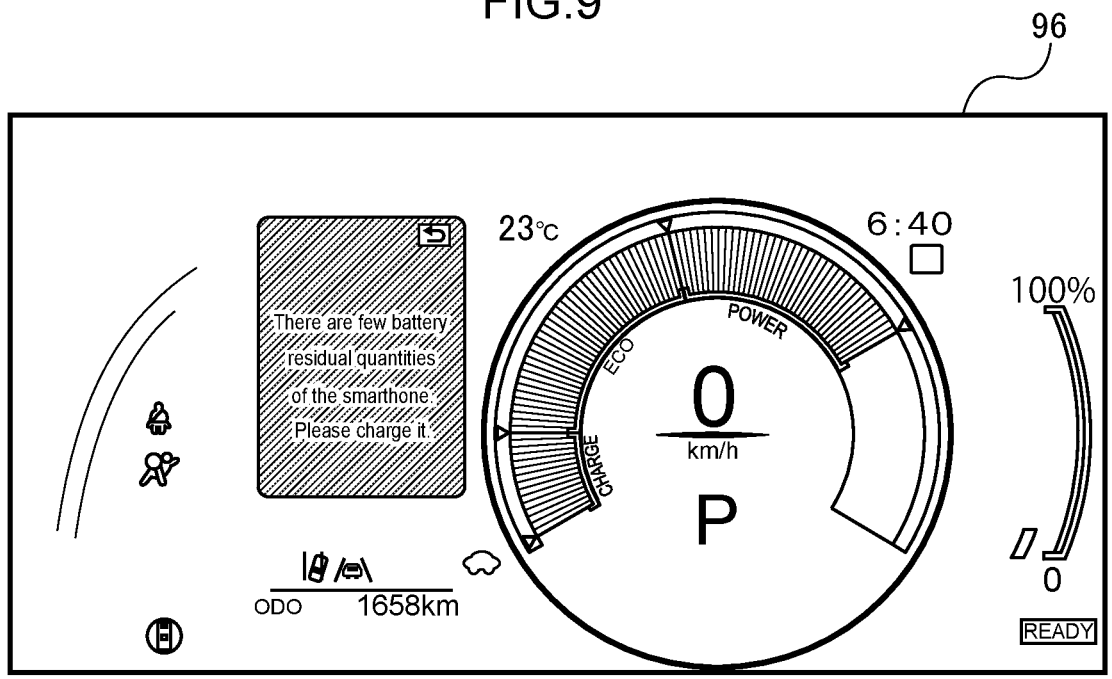
FIG. 9 is an image illustrating an example of a warning displayed on a meter display.

The meter display unit 94 includes a meter display 96 and a buzzer 98. A display on the meter display 96 is switched and the buzzer 98 is sounded in response to an instruction from the collation ECU 56. Note that an example of a display on the meter display 96 is illustrated in FIG. 9.

Figure 4:
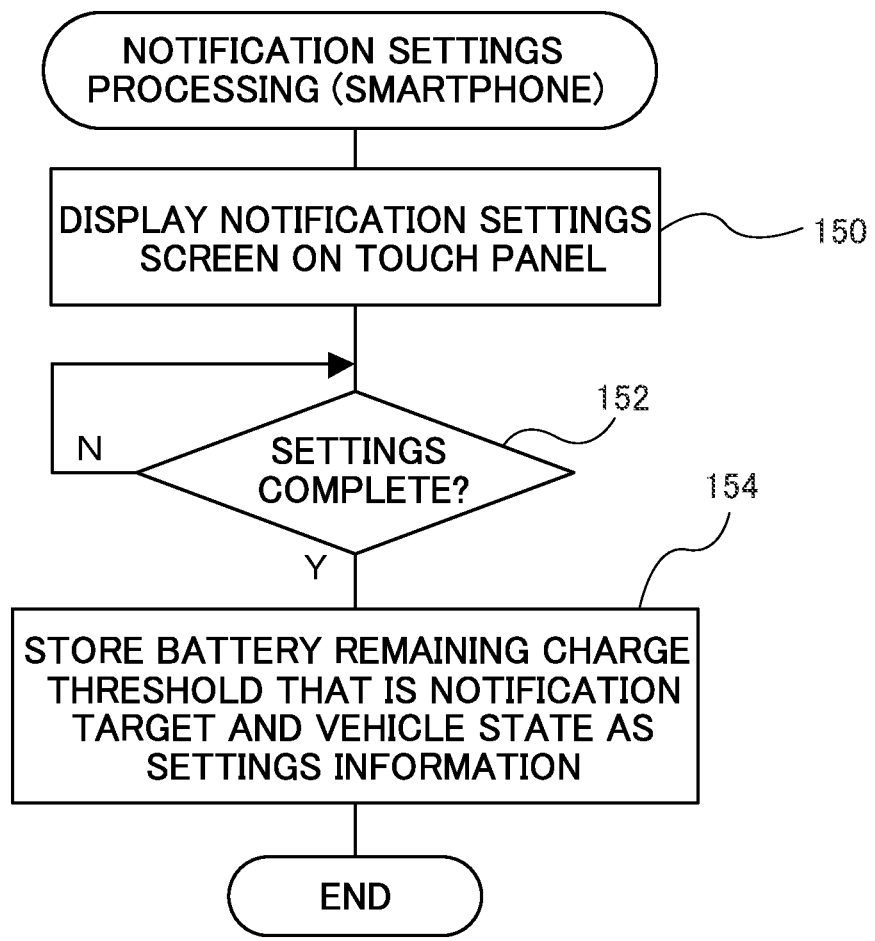
FIG. 4 is a flowchart illustrating an example of notification settings processing executed by a smartphone.

Next, explanation follows regarding notification settings processing executed by the smartphone 20 in cases in which an instruction has been made to execute settings relating to notification regarding the smartphone 20 when the remaining charge of the battery has dropped, serving as operation of the present exemplary embodiment, initially with reference to FIG. 4. At step 150 of the notification settings processing, the settings section 42 displays a notification settings screen 100 such as that illustrated in FIG. 5 as an example on the touch panel 32.

Figure 5:
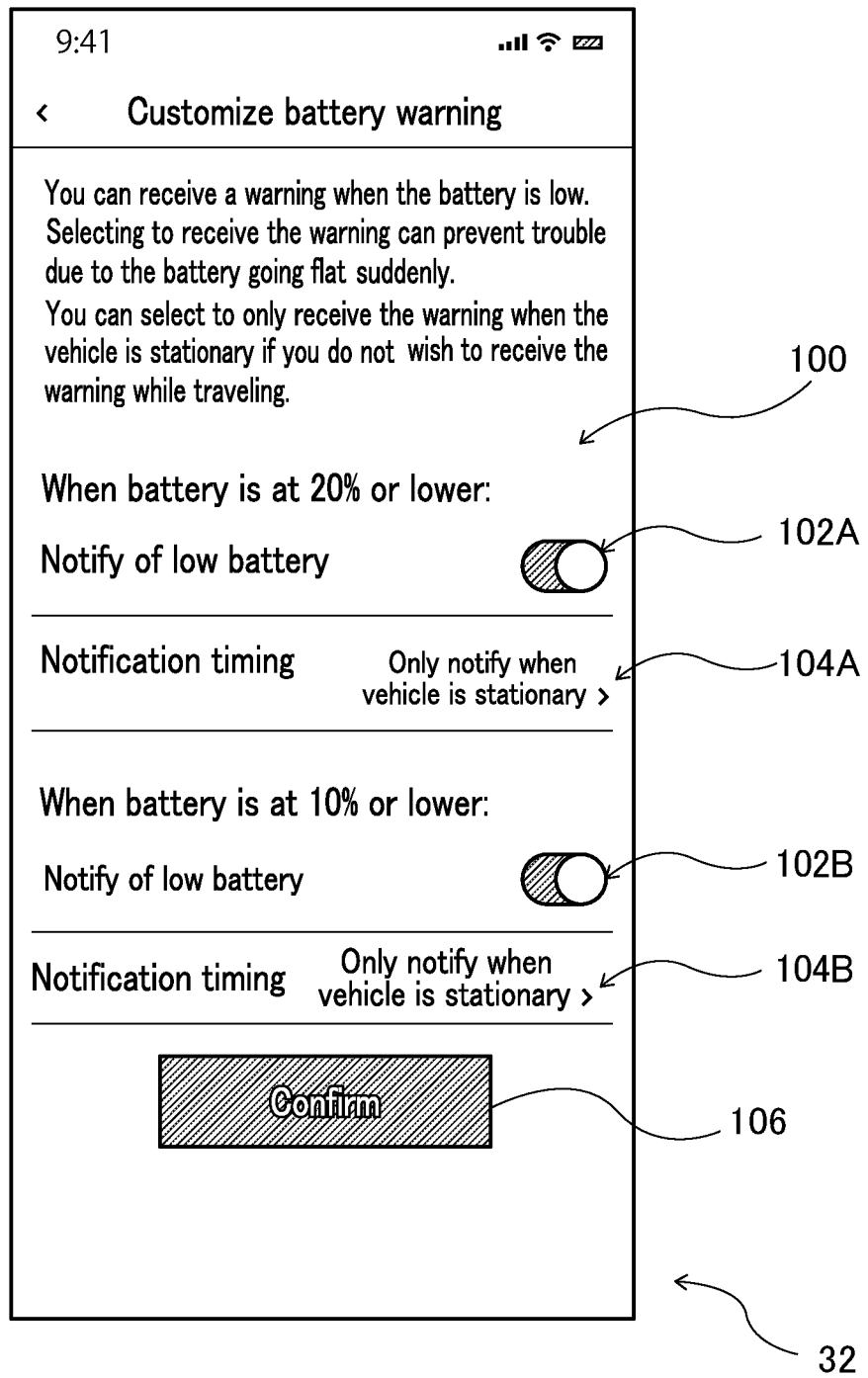
FIG. 5 is an image illustrating an example of a notification settings screen displayed on a smartphone.

As illustrated in FIG. 5, in the present exemplary embodiment there are two thresholds serving as thresholds defining a drop in the battery remaining charge, these being Bth1 and Bth2 (as an example, Bth1=20% and Bth2=10%). Toggle switches 102A, 102B that enable selection as to whether or not to set the respective thresholds Bth1, Bth2 as notification targets for a drop in the remaining charge are provided on the notification settings screen 100. In the present exemplary embodiment, options to either "Only notify when vehicle is stationary" or "Always notify" are selectable as vehicle states for notifying of a drop in the battery remaining charge in cases in which the battery remaining charge B has fallen to the threshold Bth or lower that has been set as the notification target. Dropdown menus 104A, 104B that enable selection of either vehicle state for notifying of a drop in the battery remaining charge are respectively provided for the thresholds Bth1, Bth2 on the notification settings screen 100. Note that in the present exemplary embodiment, as a default, both thresholds Bth1, Bth2 are set as notification targets of a drop in the battery remaining charge, and the option to "Only notify when vehicle is stationary" is set as the vehicle state for notifying of the drop in the battery remaining charge in both cases; however, there is no limitation thereto.

At step 152, the settings section 42 determines whether or not the settings relating to notification when the battery remaining charge has dropped performed through the notification settings screen 100 is complete. A button 106 that is tapped when the settings relating to notification when the battery remaining charge has dropped are complete is provided on the notification settings screen 100, and the determination of step 152 corresponds to a determination as to whether or not this button 106 has been tapped. In cases in which a negative determination is made at step 152, the processing of step 152 is repeated until an affirmative determination is made.

In cases in which the button 106 has been tapped after the settings relating to notification when the battery remaining charge has dropped are complete, an affirmative determination is made at step 152 and processing transitions to step 154. At step 154, the settings section 42 stores information relating to the notification when the battery remaining charge has dropped set through the notification settings screen 100, namely, the corresponding threshold Bth serving as the notification target for the drop in the battery remaining charge and the vehicle state for notifying of the drop in the battery remaining charge, in the storage section 26 as settings information 40 (see FIG. 1), and ends the notification settings processing.

Figure 6:
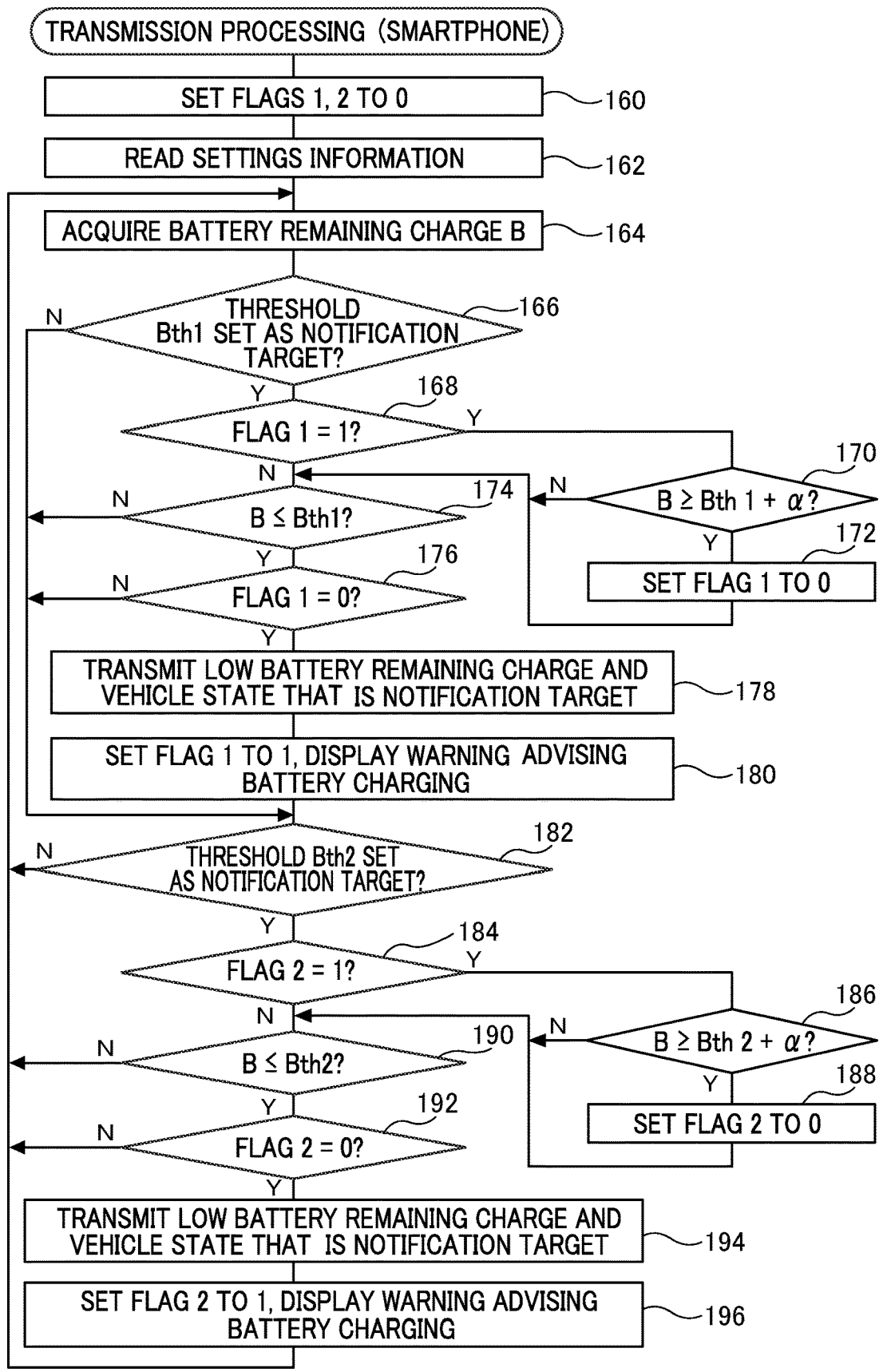
FIG. 6 is a flowchart illustrating an example of transmission processing executed by a smartphone.

Next, explanation follows regarding transmission processing performed by the smartphone 20 while the digital key application program 36 is being executed by the smartphone 20, with reference to FIG. 6. At step 160, the transmission section 44 sets both a flag 1 and a flag 2 to 0. At step 162, the transmission section 44 reads the settings information 40 from the storage section 26.

At step 164, the transmission section 44 acquires the battery remaining charge B from the battery remaining charge detection section 33. At step 166, the transmission section 44 determines whether or not the battery remaining charge threshold Bth1 has been set as a notification target for a drop in the battery remaining charge in the settings information 40. In cases in which the battery remaining charge threshold Bth1 has not been set as a notification target for a drop in the battery remaining charge, a negative determination is made at step 166 and processing transitions to step 182. In cases in which the battery remaining charge threshold Bth1 has been set as a notification target for a drop in the battery remaining charge, an affirmative determination is made at step 166 and processing transitions to step 168.

At step 168, the transmission section 44 determines whether or not the flag 1 has been set to 1. In cases in which a negative determination is made at step 168, processing transitions to step 174. At step 174, the transmission section 44 determines whether or not the battery remaining charge B is the battery remaining charge threshold Bth1 or lower. In cases in which a negative determination is made at step 174, processing transitions to step 182. On the other hand, in cases in which the battery remaining charge B has dropped to the battery remaining charge threshold Bth1 or lower, an affirmative determination is made at step 174, and processing transitions to step 176.

At step 176, the transmission section 44 determines whether or not the flag 1 is at 0. In cases in which an affirmative determination is made at step 176, processing transitions to step 178. At step 178, the transmission section 44 transmits low battery remaining charge information indicating that the battery remaining charge is low, and information indicating the vehicle state that is the notification target for the battery remaining charge threshold Bth1, to the digital key control ECU 70. At step 180, the transmission section 44 sets the flag 1 to 1, and displays a warning on the touch panel 32 to recommend charging the smartphone 20.

In cases in which the flag 1 has been set to 1 in the above manner, an affirmative determination is made at step 168 of the above-described processing, and processing transitions to step 170. At step 170, the transmission section 44 determines whether or not the battery remaining charge B has reached or exceeded a value that is a sum of the battery remaining charge threshold Bth1 and a predetermined value α (such as 10%). Note that in the transmission processing of FIG. 6, the battery remaining charge threshold Bth1 is an example of a first threshold of the present disclosure, and "Bth1+α" is an example of a second threshold of the present disclosure.

In cases in which a negative determination is made at step 170, processing transitions to step 174. In such cases, since the flag 1 is maintained as it is at 1, even in cases in which the battery remaining charge B then drops to the battery remaining charge threshold Bth1 or lower and an affirmative determination is made at step 174, a negative determination is made at step 176, and so the low battery remaining charge information etc. is not transmitted.

On the other hand, in cases in which an affirmative determination is made at step 170, processing transitions to step 172. At step 172, the transmission section 44 sets the flag 1 to 0, and processing transitions to step 174. In such cases, in cases in which the battery remaining charge B then drops to the battery remaining charge threshold Bth1 or lower, an affirmative determination is made is made at both steps 174 and 176, and so the low battery remaining charge information etc. is transmitted.

Next, explanation follows regarding the processing of step 182 onward of the transmission processing illustrated in FIG. 6. At step 182, the transmission section 44 determines whether or not the battery remaining charge threshold Bth2 has been set has been set as a notification target for a drop in the battery remaining charge in the settings information 40. In cases in which the battery remaining charge threshold Bth2 has not been set as a notification target for a drop in the battery remaining charge, a negative determination is made at step 182 and processing returns to step 164. In cases in which the battery remaining charge threshold Bth2 has been set as a notification target for a drop in the battery remaining charge, an affirmative determination is made at step 182 and processing transitions to step 184.

At step 184, the transmission section 44 determines whether or not the flag 2 has been set to 1. In cases in which a negative determination is made at step 184, processing transitions to step 190. At step 190, the transmission section 44 determines whether or not the battery remaining charge B is the battery remaining charge threshold Bth2 or lower. In cases in which a negative determination is made at step 190, processing returns to step 164. On the other hand, in cases in which the battery remaining charge B has dropped to the battery remaining charge threshold Bth2 or lower, an affirmative determination is made at step 190 and processing transitions to step 192.

At step 192, the transmission section 44 determines whether or not the flag 2 is at 0. In cases in which an affirmative determination is made at step 192, processing transitions to step 194. At step 194, the transmission section 44 transmits low battery remaining charge information and information indicating the vehicle state that is the notification target for the battery remaining charge threshold Bth2 to the digital key control ECU 70. At step 196, the transmission section 44 sets the flag 2 to 1, and displays a warning on the touch panel 32 to recommend charging the smartphone 20.

In cases in which the flag 2 is set to 1 in the above manner, an affirmative determination is made at step 184 of the above-described processing, and processing transitions to step 186. At step 186, the transmission section 44 determines whether or not the battery remaining charge B has reached or exceeded a value that is a sum of the battery remaining charge threshold Bth2 and the predetermined value a (such as 10%). Note that in the transmission processing of FIG. 6, the battery remaining charge threshold Bth2 is an example of the first threshold of the present disclosure, and "Bth2+$\alpha$" is an example of the second threshold of the present disclosure.

In cases in which a negative determination is made at step 186, processing transitions to step 190. In such cases, since the flag 2 is maintained as it is at 1, even in cases in which the battery remaining charge B then drops to the battery remaining charge threshold Bth2 or lower and an affirmative determination is made at step 190, a negative determination is made at step 192, and so the low battery remaining charge information etc. is not transmitted.

On the other hand, in cases in which an affirmative determination is made at step 186, processing transitions to step 188. At step 188, the transmission section 44 sets the flag 2 to 0 and processing transitions to step 190. In such cases, in cases in which the battery remaining charge B then drops to the battery remaining charge threshold Bth2 or lower, an affirmative determination is made is made at both steps 190 and 192, and so the low battery remaining charge information etc. is transmitted.

Figure 7:
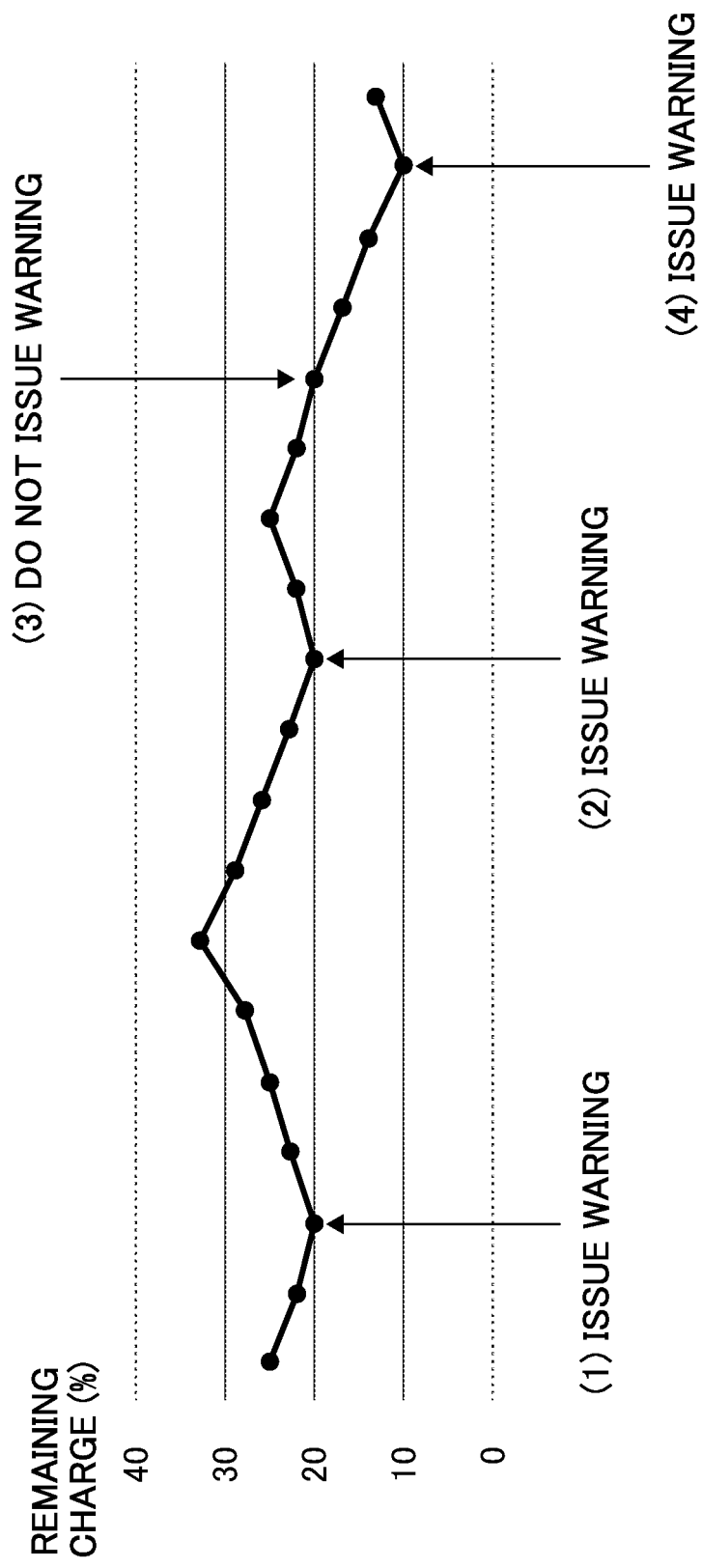
FIG. 7 is a line graph illustrating an example of remaining charge of a battery of a smartphone and warning output timings.

Further explanation follows regarding operation of the above-described transmission processing, with reference to FIG. 7. Note that FIG. 7 illustrates a case in which both the battery remaining charge threshold Bth1 (=20%) and the battery remaining charge threshold Bth2 (=10%) are set as notification targets for a drop in remaining charge. In FIG. 7, the predetermined value $\alpha$=10%.

During the transition of the battery remaining charge B illustrated in FIG. 7, first, the battery remaining charge B drops from approximately 25% to 20% (=threshold Bth1) or lower. This corresponds to a case in which the battery remaining charge B has dropped to the threshold Bth1 or lower a first time, and so the flag 1 is still at 0. Thus, the low battery remaining charge information etc. is transmitted as indicated by the notation "(1) ISSUE WARNING" in FIG. 7. The flag 1 is set to 1 at this time.

During the transition of the battery remaining charge B illustrated in FIG. 7, next, the battery is charged, and so the battery remaining charge B temporarily recovers to 30% (=threshold Bth1+predetermined value $\alpha$) or higher, after which the battery remaining charge B again drops to 20% (=threshold Bth1) or lower. When this occurs, the flag 1 is again set to 0 as a result of the battery remaining charge B temporarily recovering to 30% or higher. Thus, the low battery remaining charge information etc. is transmitted as indicated by the notation "(2) ISSUE WARNING" in FIG. 7. The flag 1 is set to 1 at this time.

During the transition of the battery remaining charge B illustrated in FIG. 7, next, although the battery has been charged, the battery remaining charge B again drops to 20% (=threshold Bth1) or lower without the battery remaining charge B first recovering to 30% (=threshold Bth1+predetermined value $\alpha$) or higher. When this occurs, the battery remaining charge B has not recovered to 30% or higher, and so the flag 1 is still at 1. Thus, the low battery remaining charge information etc. is not transmitted, as indicated by the notation "(3) DO NOT ISSUE WARNING" in FIG. 7. This enables the low battery remaining charge information, etc. to be suppressed from being consecutively transmitted on frequent occasions in cases in which the battery remaining charge B is fluctuating in the vicinity of 20% (=threshold Bth1) during the transmission processing of FIG. 6.

During the transition of the battery remaining charge B illustrated in FIG. 7, next, the battery remaining charge B drops to 10% (=threshold Bth2) or lower. This corresponds to a case in which the battery remaining charge B has dropped to the threshold Bth2 or lower a first time, and so the flag 2 is still at 0. Thus, the low battery remaining charge information etc. is transmitted as indicated by the notation "(4) ISSUE WARNING" in FIG. 7.

Figure 8:
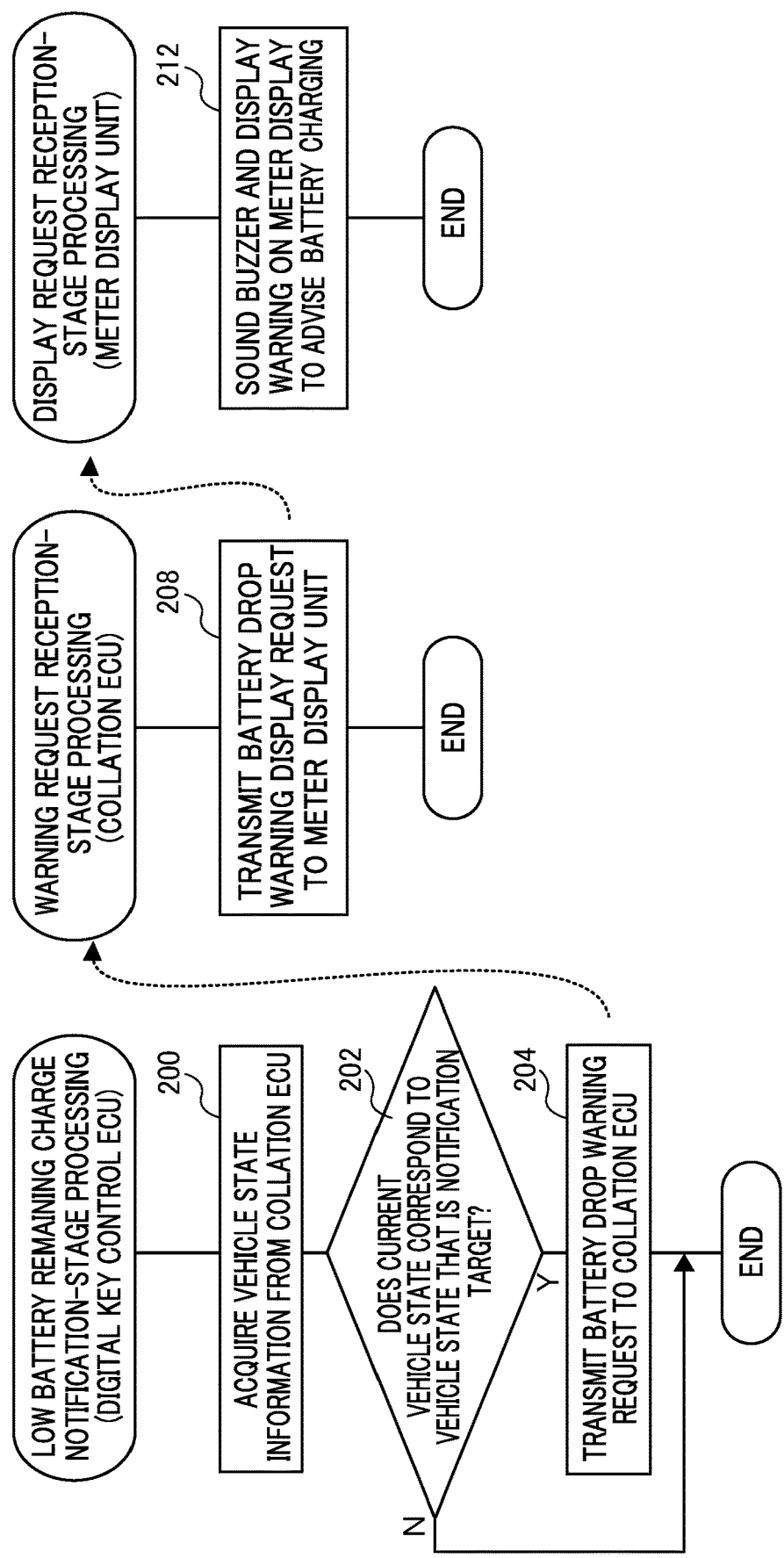
FIG. 8 is a flowchart illustrating an example of processing executed by a digital key control ECU, and collation ECU, and a meter display unit in cases in which a notification of a low battery remaining charge has been received from a smartphone.

Next, explanation follows regarding processing performed by the digital key control ECU 70, the collation ECU 56, and the meter display unit 94, with reference to FIG. 8.

The digital key control ECU 70 performs low battery remaining charge notification-stage processing illustrated in FIG. 8 on receiving the low battery remaining charge information and the information indicating the vehicle state for notifying of the drop in the battery remaining charge from the smartphone 20. At step 200 of the low battery remaining charge notification-stage processing, the acquisition section 88 acquires information relating to the current vehicle state (such as the shift position and vehicle speed) from the collation ECU 56.

At step 202, the determination section 92 determines whether or not the current vehicle state indicated in the information acquired at step 200 corresponds to the vehicle state for notifying of a drop in the battery remaining charge. For example, in cases in which the vehicle state for notifying of a drop in the battery remaining charge is "only notify when vehicle is stationary", an affirmative determination is made at step 202 in cases in which the shift position is a P range and the vehicle speed is 0. Alternatively, in cases in which the vehicle state for notifying of a drop in the battery remaining charge is "always notify", an affirmative determination is made is made at step 202 unconditionally.

In cases in which an affirmative determination is made at step 202, processing transitions to step 204. At step 204, the notification section 90 of the digital key control ECU 70 transmits a battery drop warning request to the collation ECU 56, and ends the low battery remaining charge notification-stage processing. On the other hand, in cases in which a negative determination is made at step 202, the processing of step 204 is skipped and the low battery remaining charge notification-stage processing is ended.

On receiving the battery drop warning request from the digital key control ECU 70, the collation ECU 56 performs warning request reception-stage processing illustrated in FIG. 8. At step 208 of this warning request reception-stage processing, the notification section 90 of the collation ECU 56 transmits a battery drop warning display request to the meter display unit 94, and ends the warning request reception-stage processing.

On receiving the battery drop warning display request from the collation ECU 56, at step 212 in FIG. 8, the meter display unit 94 sounds the buzzer 98 and displays a warning message on the meter display 96 to recommend charging the battery of the smartphone 20. The user is thereby recommended to charge the battery of the smartphone 20. A notation such as "Smartphone battery is low. Please charge."

(see FIG. 9 also) may be employed as an example of the warning message. The warning message is not limited to English language and may be in other languages.

As described above, the vehicle 50 according to the present exemplary embodiment includes the acquisition section 88 and the notification section 90. The acquisition section 88 acquires information relating to the remaining charge of the battery of the smartphone 20 that is capable of acting as a digital key employed in control of the vehicle 50. The notification section 90 performs predetermined notification in cases in which both a determination is made that the battery remaining charge of the smartphone 20 is the predetermined threshold or lower based on the battery remaining charge-related information for the smartphone 20 as acquired by the acquisition section 88 and the vehicle 50 is in the preset vehicle state. This enables a prompt for caution relating to the battery of the smartphone 20 going flat to be made at a suitable timing.

Moreover, in the present exemplary embodiment, the vehicle state is preset through the smartphone 20, and the acquisition section 88 acquires the information indicating the preset vehicle state from the smartphone 20. This enables a prompt for caution relating to the battery of the smartphone 20 going flat to be made at an even more suitable timing.

Moreover, the vehicle 50 according to the present exemplary embodiment also includes the determination section 92 that determines whether or not the vehicle 50 is in the preset vehicle state. This enables a prompt for caution relating to the battery of the smartphone 20 going flat to be made at an even more suitable timing.

Moreover, in the present exemplary embodiment, the acquisition section 88 acquires the information from the smartphone 20 through communication following the BLE standard. This enables an ordinary smartphone to be employed as the information processing device.

Moreover, in the present exemplary embodiment, the notification section 90 sounds the buzzer as the predetermined notification. The user thereby receives an audible stimulus, thereby enabling a prompt for caution relating to the battery of the smartphone 20 going flat to be made at a suitable timing.

Moreover, in the present exemplary embodiment, the notification section 90 also displays a warning on the meter display to recommend charging the smartphone 20 as the predetermined notification. The user thereby receives a visual stimulus, thereby enabling a prompt for caution relating to the battery of the smartphone 20 thereby enabling a prompt for caution relating to the battery of the smartphone 20 going flat to be made at a suitable timing to be made at a suitable timing.

Moreover, in the present exemplary embodiment, the smartphone 20 includes the transmission section 44 that transmits the battery remaining charge-related information to the vehicle 50 in cases in which a determination is made that the battery remaining charge of the smartphone 20 has fallen to the first threshold or lower. The transmission section 44 also transmits the battery remaining charge-related information to the vehicle 50 in cases in which a determination is made that the battery remaining charge that was once the first threshold or lower and then recovered to the second threshold higher than the first threshold has again fallen to the first threshold or lower. On the other hand, the transmission section 44 does not transmit the battery remaining charge-related information to the vehicle 50 in cases in which a determination is made that the battery remaining charge that was once the first threshold or lower has again fallen to the first threshold or lower without first recovering to the second threshold. This enables the notification by the notification section 90 to be suppressed from being consecutively performed on frequent occasions in cases in which the battery remaining charge of the smartphone 20 is fluctuating in the vicinity of the first threshold.

Note that in the above exemplary embodiment a case has been described in which the smartphone 20 serves as an example of the information processing device of the present disclosure. However, the information processing device of the present disclosure is not limited to a format in which the touch panel 32 (display section) on which the notification settings screen is displayed is housed in the same casing as the CPU 22, the memory 24, the non-volatile storage section 26, etc., as in the smartphone 20. For example, in the information processing device according to the present disclosure, a display section on which the notification settings screen is displayed may be provided separately to a casing that houses the CPU 22, the memory 24, the non-volatile storage section 26, etc. In such cases, the display section may be configured by smart glasses or the like.

Moreover, in the above exemplary embodiment a case has been described in which the communication between the smartphone 20 and the vehicle 50 side (the digital key control ECU 70) is wireless communication following the BLE standard. However, the wireless communication is not limited to the BLE standard, and wireless communication may be performed following another standard, such as Wi-Fi (registered trademark).

Furthermore, in the above exemplary embodiment a format has been described in which the vehicle state for notifying a drop in the battery remaining charge is selectable from two options, these being "Only notify when vehicle is stationary" and "Always notify". However, the present disclosure is not limited thereto. For example, "Only notify when the vehicle speed is less than a threshold" may be added to the options as an example of a vehicle state for notifying a drop in the battery remaining charge.

Furthermore, in the above exemplary embodiment a format has been described in which the vehicle 50 side is notified at a timing when the battery remaining charge B has fallen to equal to or lower than the battery remaining charge threshold Bth that is the notification target; however, the present disclosure is not limited thereto. For example, the vehicle 50 side may be notified of the battery remaining charge threshold Bth in advance, and the vehicle 50 side may also be periodically notified of the battery remaining charge B serving as the battery remaining charge-related information, such that the vehicle 50 side determines whether or not the battery remaining charge B has fallen to the battery remaining charge threshold Bth or lower.

Moreover, in the above description a format has been described in which the collation program 68 and the digital key control program 84, serving as examples of a notification program according to the present disclosure, are pre-stored in the respective storage sections 60, 76. However, a notification program according to the present disclosure may be provided in a format recorded onto a non-transitory computer-readable recording medium, such as an HDD, an SSD, or a DVD.

The present disclosure provides a vehicle, a notification system, a notification method, and a non-transitory computer-readable storage medium stored with a notification program that are capable of prompting caution relating to a battery of an information processing device going flat at a suitable timing.

A first aspect of the present disclosure is a vehicle, that includes: a memory; and a processor coupled to the memory, the processor being configured to: acquire information relating to a remaining charge of a battery of a terminal configured to act as a digital key employed in control of a vehicle; and perform a predetermined notification in response to both of a determination being made that the remaining charge of the battery of the terminal is a predetermined threshold or lower based on the acquired information, and the vehicle being in a preset vehicle state.

In the first aspect, the predetermined notification is performed in cases in which both a determination is made that the remaining charge of the battery of the information processing device is the predetermined threshold or lower and the vehicle is in the preset vehicle state. This enables a prompt for caution relating to the battery of the information processing device going flat to be made at a suitable timing.

A second aspect of the present disclosure is the vehicle of the first aspect, wherein: the vehicle state is preset via the terminal; and the processor is configured to acquire information indicating the preset vehicle state from the terminal.

In the second aspect, the vehicle state for when to perform the predetermined notification can be set through the information processing device. This enables a prompt for caution relating to the battery of the information processing device going flat to be made at an even more suitable timing.

A third aspect of the present disclosure is the vehicle of the first or the second aspect, wherein the processor is further configured to determine whether or not the vehicle is in the preset vehicle state.

In the third aspect, determining whether or not the vehicle is in the preset vehicle state enables a prompt for caution relating to the battery of the information processing device going flat to be made at an even more suitable timing.

A fourth aspect of the present disclosure is the vehicle of any of the first to the third aspects, wherein the processor is configured to acquire the information from the terminal via Bluetooth standard-compliant communications.

Since smartphones are generally installed with a function to perform communication following the Bluetooth standard, the fourth aspect enables an ordinary smartphone to be employed as the information processing device.

A fifth aspect of the present disclosure is the vehicle of any of the first to the fourth aspects, wherein the processor is configured to sound a buzzer as the predetermined notification.

In the fifth aspect, providing an audible stimulus enables a prompt for caution relating to the battery of the information processing device going flat to be made at a suitable timing.

A sixth aspect of the present disclosure is the vehicle of any of the first to the fifth aspects, wherein the processor is configured to display a warning on a meter display to recommend charging the terminal as the predetermined notification.

In the sixth aspect, providing a visual stimulus enables a prompt for caution relating to the battery of the information processing device going flat to be made at a suitable timing.

A seventh aspect of the present disclosure is a notification system, that includes: a terminal configured to act as a digital key employed in control of a vehicle; and a vehicle, wherein the vehicle includes: a first memory; and a first processor coupled to the first memory, the first processor being configured to: acquire information relating to a remaining charge of a battery of the terminal; and perform a predetermined notification in response to both of a determination being made that the remaining charge of the battery of the terminal is a predetermined threshold or lower based on the acquired information, and the vehicle being in a preset vehicle state.

In the seventh aspect, a prompt for caution relating to the battery of the information processing device going flat can be made at a suitable timing, similarly to in the first aspect.

An eighth aspect of the present disclosure is the notification system of the seventh aspect, wherein: the vehicle state is preset via the terminal; and the first processor is configured to acquire the preset vehicle state from the terminal.

In the eighth aspect, the vehicle state for when to perform the predetermined notification can be set through the information processing device. This enables a prompt for caution relating to the battery of the information processing device going flat to be made at an even more suitable timing.

A ninth aspect of the present disclosure is the notification system of the seventh or the eighth aspect, wherein the first processor is further configured to determine whether or not the vehicle is in the preset vehicle state.

In the ninth aspect, determining whether or not the vehicle is in the preset vehicle state enables a prompt for caution relating to the battery of the information processing device going flat to be made at an even more suitable timing.

A tenth aspect of the present disclosure is the notification system of any one of the seventh to the ninth aspects, wherein the first processor is configured to acquire the information from the terminal via Bluetooth standard-compliant communications.

Since smartphones are generally installed with a function to perform communication following the Bluetooth standard, the tenth aspect enables an ordinary smartphone to be employed as the information processing device.

An eleventh aspect of the present disclosure is the notification system of any of the seventh to the tenth aspects, wherein the first processor is configured to sound a buzzer as the predetermined notification.

In the eleventh aspect, providing an audible stimulus enables a prompt for caution relating to the battery of the information processing device going flat to be made at a suitable timing.

A twelfth aspect of the present disclosure is the notification system of any of the seventh to the eleventh aspects, wherein the first processor is configured to display a warning on a meter display to recommend charging the terminal as the predetermined notification.

In the twelfth aspect, providing a visual stimulus enables a prompt for caution relating to the battery of the information processing device going flat to be made at a suitable timing.

A thirteenth aspect of the present disclosure is the notification system of any of the seventh to the twelfth aspects, wherein the terminal includes: a second memory; and a second processor coupled to the second memory, the second processor being configured to: transmit information relating to the remaining charge of the battery to the vehicle in response to a determination being made that the remaining charge of the battery has fallen to a first threshold or lower, and also transmit the battery remaining charge-related information to the vehicle in response to a determination being made that the remaining charge of the battery that had once been the first threshold or lower and then recovered to a second threshold higher than the first threshold has again fallen to the first threshold or lower, but not transmit the battery remaining charge-related information to the vehicle in response to a determination being made that the remaining charge of the battery that had once been the first threshold or lower has again fallen to the first threshold or lower without first recovering to the second threshold.

In the thirteenth aspect, notification by the notification section can be suppressed from being consecutively performed on frequent occasions in cases in which the remaining charge of the battery of the information processing device is fluctuating in the vicinity of the first threshold.

A fourteenth aspect of the present disclosure is a notification method, that includes: by a processor of a vehicle: acquiring information relating to a remaining charge of a battery of a terminal configured to act as a digital key employed in control of the vehicle; and performing a predetermined notification in response to both of a determination being made that the remaining charge of the battery of the terminal is a predetermined threshold or lower based on the acquired information, and the vehicle being in a preset vehicle state.

In the fourteenth aspect, a prompt for caution relating to the battery of the information processing device going flat can be made at a suitable timing, similarly to in the first aspect.

A fifteenth aspect of the present disclosure is a non-transitory computer-readable storage medium storing a notification program executable by a computer installed at a vehicle to perform processing, the processing including: acquiring information relating to a remaining charge of a battery of a terminal configured to act as a digital key employed in control of the vehicle; and performing a predetermined notification in response to both of a determination being made that the remaining charge of the battery of the terminal is a predetermined threshold or lower based on the acquired information, and the vehicle being in a preset vehicle state.

In the fifteenth aspect, a prompt for caution relating to the battery of the information processing device going flat can be made at a suitable timing, similarly to in the first aspect.

The present disclosure enables a prompt for caution relating to the battery of the information processing device going flat to be made at a suitable timing.

What is claimed is:

1. A notification system, comprising:
a terminal configured to act as a digital key employed in control of a vehicle; and
a vehicle, wherein the vehicle includes:
a first memory; and
a first processor coupled to the first memory, the first processor being configured to:
acquire information relating to a remaining charge of a battery of the terminal; and
perform a predetermined notification in response to both of a determination being made that the remaining charge of the battery of the terminal is a predetermined threshold or lower based on the acquired information, and at least one of a vehicle speed or a shift position of the vehicle being in a preset vehicle state,
wherein the terminal includes:
a second memory; and
a second processor coupled to the second memory, the second processor being configured to:
transmit information relating to the remaining charge of the battery to the vehicle in response to a determination being made that the remaining charge of the battery has fallen to a first threshold or lower, and also transmit the battery remaining charge-related information to the vehicle in response to a determination being made that the remaining charge of the battery that had once been the first threshold or lower and then recovered to a second threshold higher than the first threshold has again fallen to the first threshold or lower, but
not transmit the battery remaining charge-related information to the vehicle in response to a determination being made that the remaining charge of the battery that had once been the first threshold or lower has again fallen to the first threshold or lower without first recovering to the second threshold.

2. The notification system of claim 1, wherein:
the vehicle state is preset via the terminal; and
the first processor is configured to acquire the preset vehicle state from the terminal.

3. The notification system of claim 1, wherein the first processor is further configured to determine whether or not the vehicle is in the preset vehicle state.

4. The notification system of claim 1, wherein the first processor is configured to acquire the information from the terminal via Bluetooth standard-compliant communications.

5. The notification system of claim 1, wherein the first processor is configured to sound a buzzer as the predetermined notification.

6. The notification system of claim 1, wherein the first processor is configured to display a warning on a meter display to recommend charging the terminal as the predetermined notification.

* * * * *